(12) United States Patent
Yin et al.

(10) Patent No.: US 8,748,272 B2
(45) Date of Patent: Jun. 10, 2014

(54) METHOD OF INTRODUCING STRAIN INTO CHANNEL AND DEVICE MANUFACTURED BY USING THE METHOD

(75) Inventors: Huaxiang Yin, Beijing (CN); Qiuxia Xu, Beijing (CN); Dapeng Cheng, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 43 days.

(21) Appl. No.: 13/318,344

(22) PCT Filed: Apr. 20, 2011

(86) PCT No.: PCT/CN2011/000694
§ 371 (c)(1),
(2), (4) Date: Oct. 31, 2011

(87) PCT Pub. No.: WO2012/094783
PCT Pub. Date: Jul. 19, 2012

(65) Prior Publication Data
US 2012/0181634 A1      Jul. 19, 2012

(51) Int. Cl.
| H01L 21/336 | (2006.01) |
| H01L 29/76 | (2006.01) |
| H01L 29/66 | (2006.01) |
| H01L 29/78 | (2006.01) |
| H01L 29/10 | (2006.01) |
| H01L 21/8238 | (2006.01) |

(52) U.S. Cl.
CPC ........ *H01L 29/7843* (2013.01); *H01L 29/7845* (2013.01); *H01L 29/7847* (2013.01); *H01L 29/66545* (2013.01); *H01L 29/1054* (2013.01); *H01L 21/823842* (2013.01)
USPC ........... 438/283; 257/288; 257/347; 257/365; 257/368; 438/294; 438/297; 438/301

(58) Field of Classification Search
CPC .................. H01L 29/66545; H01L 29/7843; H01L 29/7845; H01L 21/823842; H01L 29/7847; H01L 21/28185; H01L 21/28061; H01L 21/28088; H01L 29/1054; H01L 29/7842; Y10S 438/938
USPC .......... 257/288, 347, 365, E29.255; 438/283, 438/294–301
See application file for complete search history.

(56) References Cited

U.S. PATENT DOCUMENTS

| 7,531,398 B2 * | 5/2009 | Zhang et al. .................. 438/197 |
| 2006/0071285 A1 * | 4/2006 | Datta et al. ..................... 257/407 |

(Continued)

FOREIGN PATENT DOCUMENTS

| CN | 1296639 A | 5/2001 | ............ H01L 21/336 |
| CN | 1591803 A | 3/2005 | ............ H01L 21/336 |
| CN | 101060085 A | 10/2007 | ............ H01L 21/336 |

*Primary Examiner* — Yasser A Abdelaziez
*Assistant Examiner* — Cory Eskridge
(74) *Attorney, Agent, or Firm* — Martine Penilla Group, LLP (57) ABSTRACT

The present invention relates to a method of introducing strain into a channel and a device manufactured by using the method, the method comprising: providing a semiconductor substrate; forming a channel in the semiconductor substrate; forming a first gate dielectric layer on the channel; forming a polysilicon gate layer on the first gate dielectric layer; doping or implanting a first element into the polysilicon gate layer; removing a part of the first gate dielectric layer and polysilicon gate layer to thereby form a first gate structure; forming a source/drain extension region in the channel; forming spacers on both sides of the first gate structure; forming a source/drain in the channel; and performing annealing such that lattice change occurs in the polysilicon that is doped or implanted with the first element in the high-temperature crystallization process, thereby producing a first strain in the polysilicon gate layer, and introducing the first strain through the gate dielectric layer to the channel. This method has greater process flexibility and simple process complexity with no additional process cost.

16 Claims, 8 Drawing Sheets

(56) References Cited

U.S. PATENT DOCUMENTS

2007/0108529 A1* 5/2007 Huang et al. .................. 257/368
2007/0278583 A1* 12/2007 Luo et al. ...................... 257/368
2008/0057665 A1 3/2008 Lindsay ........................ 438/400
2008/0286916 A1* 11/2008 Luo et al. ...................... 438/197

* cited by examiner

METHOD OF INTRODUCING STRAIN INTO CHANNEL AND DEVICE MANUFACTURED BY USING THE METHOD

CROSS REFERENCE

This application is a National Phase application of, and claims priority to, PCT Application No. PCT/CN2011/000694, filed on Apr. 20, 2011, entitled 'Method Of Introducing Strain Into Channel And Device Manufactured By Using The Method', which claimed priority to Chinese Application No. CN 201110007408.8, filed on Jan. 1, 2011. Both the PCT Application and Chinese Application are incorporated herein by reference in their entireties.

FIELD OF THE INVENTION

The present invention relates to a method of introducing strain into a channel and a device manufactured by using the method.

BACKGROUND OF THE INVENTION

Figure 1:
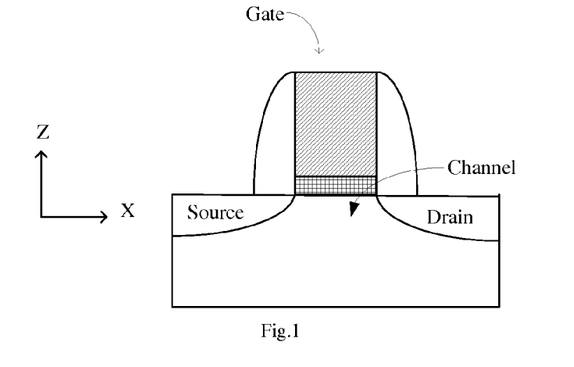
FIG. 1 is a schematic diagram illustrating an optimal introducing direction for inducing strain into a channel using a uniaxial process.

It has been approved by both theory and empirical studies that when a stress is applied to the channel of a transistor, strain is produced in the semiconductor lattice in a channel region, then the carrier mobility of the transistor will be enhanced or reduced; however, it is also known that electrons and holes may have different responses to the same type of strain. For example, application of compressive stress in a longitudinal direction of flow of electrical current causes compressive strain to occur in the lattice in the channel region, which is advantageous for enhancing the hole mobility, but the electron mobility is correspondingly decreased. Application of tensile stress in the longitudinal direction causes tensile strain to occur in the lattice in the channel region, which is advantageous for enhancing the electron mobility, but the hole mobility is correspondingly decreased. With continuous reduction in the device feature size, strain channel engineering for the purpose of enhancing the channel carrier mobility plays a more and more important role. Multiple uniaxial process induced strains are integrated to a device process. In terms of the optimal introducing direction of the uniaxial process induced strain, as for an NMOS device, introduction of tensile strain in a direction along the channel, that is, direction X as well as introduction of compressive strain in a direction perpendicular to the channel, that is, direction Z are most effective for enhancing the mobility of electrons in the channel, as shown in FIG. 1; on the other hand, as for a PMOS device, introduction of compressive strain in the direction X is most effective for enhancing the mobility of holes in the channel. A lot of methods have been developed based on this theory. One of the methods is to produce "global strain", that is, the stress, which is produced from the substrate, is applied to the overall transistor device area. The global strain is produced by using the following structures such as a global strain silicon layer formed by epitaxially growing materials of SiGe and SiC etc. of different lattice constants on a buffer layer which is on an ordinary substrate and further growing thereon a low-defect single crystal silicon layer, or the SiGe structure and strained silicon structure on an insulator realized by using the method of manufacturing the silicon on an insulator. Another method is to produce "local strain", that is, using the local structure that is adjacent to the device channel or the technique thereof to produce a corresponding stress to be applied to the channel region to produce strain, local strain is generally produced by using the following structures such as shallow trench isolation structure that produces a stress, (dual) stress liner, SiGe structure embedded into source/drain (S/D) region of a PMOS (e-SiGe), Σ-shaped SiGe structure embedded into source/drain (S/D) region of a PMOS, and SiC structure embedded into the source/drain (S/D) region of an NMOS (e-SiC). However, among the above methods for producing channel local strain and changing the type of strain act on the channel, some require a complicated process, and some may introduce defects to the channel. On the other hand, with continuous reduction in the device feature size, the induced strain effect brought forward by the above method is continuously weakened.

In view of the above reasons, there still exists a need for introducing a new method and semiconductor structure for realizing enhanced strain for both tiny sized NMOS device and PMOS device, furthermore control of the level and type of introduced strain is also needed.

SUMMARY OF THE INVENTION

In a first aspect of the invention, there is provided a method of introducing strain into the channel of a MOS device, comprising: providing a semiconductor substrate; forming a channel in the semiconductor substrate; forming a first gate dielectric layer on the channel; forming a polysilicon gate layer on the first gate dielectric layer; doping or implanting a first element into the polysilicon gate layer; removing a part of the first gate dielectric layer and polysilicon gate layer to thereby form a first gate structure; forming a source/drain extension region in the channel; forming spacers on both sides of the first gate structure; forming a source/drain in the channel; and performing annealing such that lattice change occurs in the polysilicon that is doped or implanted with the first element in the high-temperature crystallization process, thereby producing a first strain including the strain in a direction along the channel and the strain in a direction perpendicular to the channel in the polysilicon gate layer, and introducing the first strain to the channel through the gate dielectric layer to cause a change in the size of the semiconductor lattice in the surface layer of the channel region such that the first strain is maintained in the channel.

In a further aspect of the present invention, there is provided a MOS device, comprising: a semiconductor substrate; a channel formed in the semiconductor substrate; a second gate structure formed above the channel, comprising a second gate dielectric layer and a metal gate layer over the second gate dielectric layer; a source/drain extension region formed in the channel; spacers formed on both sides of the second gate structure; a source/drain formed in the channel; an interlayer dielectric layer formed on the source/drain and the second gate structure; and a sour/drain metal contact; wherein the second gate dielectric layer and the metal gate layer are obtained by replacing the first gate dielectric layer and the polysilicon gate layer obtained via the steps as stated in claim 1, wherein a change occurs in the size of the semiconductor lattice in the surface layer of the channel region such that the first strain is maintained in the channel.

In the present invention, strain can be introduced into a channel only by adding the step of doping/implanting and using the annealing process in normal steps, further, the level of strain and the extent of strain in a channel can be simply controlled by one of the following means: changing the doped or implanted elements or the combination thereof, controlling the dose of the doped or implanted elements, controlling the distribution profile of the doped or implanted elements, and controlling the annealing conditions, thus the invention has greater process flexibility and simple process complexity, without any additional process cost.

BRIEF DESCRIPTION OF THE DRAWINGS

To understand the present invention well and to show how it is effected, the accompanying drawings will now be referenced through the embodiments, wherein:

FIGS. 2a-1 illustrate the steps for manufacturing an NMOS device according to an embodiment of the present invention;

FIGS. 3a-1 illustrate the steps for manufacturing a PMOS device according to an embodiment of the present invention.

DETAILED DESCRIPTION OF THE INVENTION

One or more aspects of the embodiment of the present invention will described by referring to the accompanying drawings below, where identical elements will be generally indicated by identical reference signs throughout the drawings. In the following descriptions, many specific details are elaborated for the purpose of explanation so as to facilitate thorough understanding of one or more aspects of the embodiments of the present invention. However, it may be apparent to those skilled in the art that they may use few of these specific details to implement one or more aspects of the embodiment of the present invention.

In addition, although the specific features or aspects of an embodiment are merely disclosed by one of the implementing modes, such specific features or aspects may be incorporated with one or more other features or aspects of other implementing modes that may be advantageous to and desired by any given or specific application.

First Embodiment

In this embodiment, the steps for manufacturing an NMOS device by using this method are provided. A semiconductor substrate 202 is provided, the semiconductor substrate may be of any type known in the field of electronics, such as bulk semiconductor, Semiconductor-On-Insulator (SOI), and the semiconductor substrate may be strained, non-strained, or may comprise therein a strain zone or a non-strain zone. When a semiconductor substrate is provided, isolation areas such as Shallow Trench Isolation (STI) area or Field Isolation area made of materials with or without stress are formed in the semiconductor substrate 202 by using the traditional technology commonly known in the art.

Figure 2A:
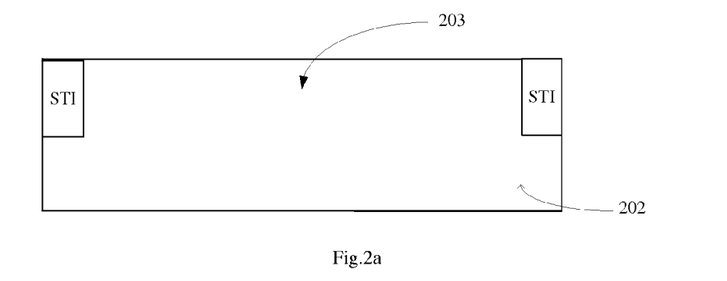

A channel 203 is formed on the semiconductor substrate in the active region between the isolation areas, as shown in FIG. 2a.

Figure 2B:
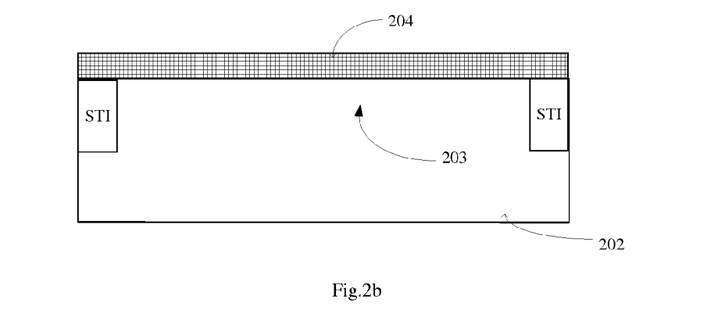

A gate dielectric layer 204 is formed on the channel, as shown in FIG. 2b, the materials of the gate dielectric layer 204 may include high-K dielectric constant material or low-K dielectric constant material, such as $SiO_2$, $SiON$, $ZrO_2$, $HfO_2$, $Al_2O_3$, HfSiO, HfAlO, HfSiON, HfAlSiO, HfTaSiO and/or combination thereof, and/or multi-layer structures thereof. The gate dielectric layer 204 may be formed by thermal growth processes such as oxidation, nitridation, or oxynitridation. As an alternative, the gate dielectric layer may be formed by deposition processes such as Chemical Vapor Deposition (CVD), plasma-assisted CVD, Atomic Layer Deposition (ALD), evaporation, reactive sputtering, chemical solution deposition or other similar deposition processes, and the gate dielectric layer 204 may also be formed by the combination of any of the above processes.

Figure 2C:
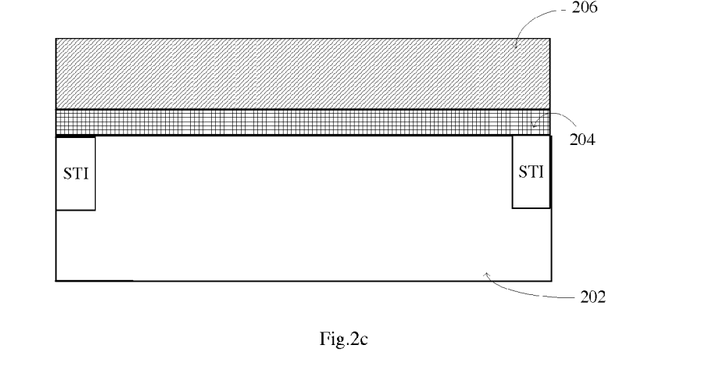

When the gate dielectric layer 204 is formed, a polysilicon gate layer 206 is formed on the gate dielectric layer 204, as shown in FIG. 2c.

Figure 2D:
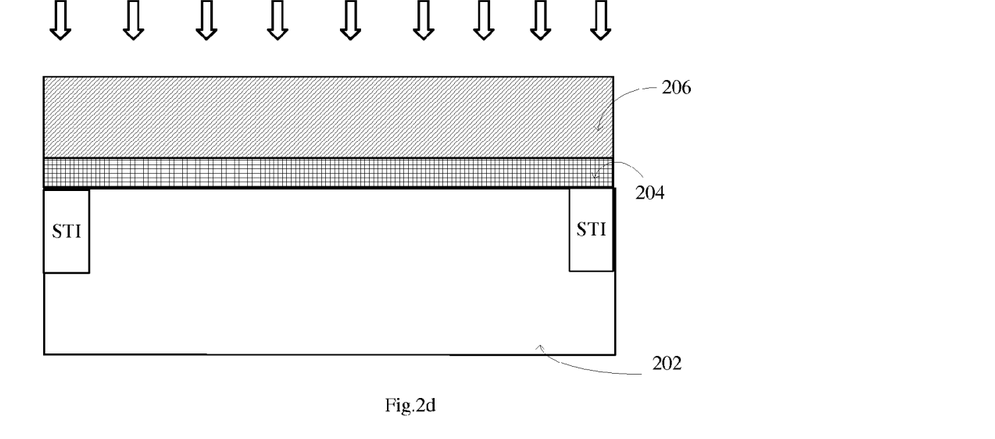
Figure 2E:
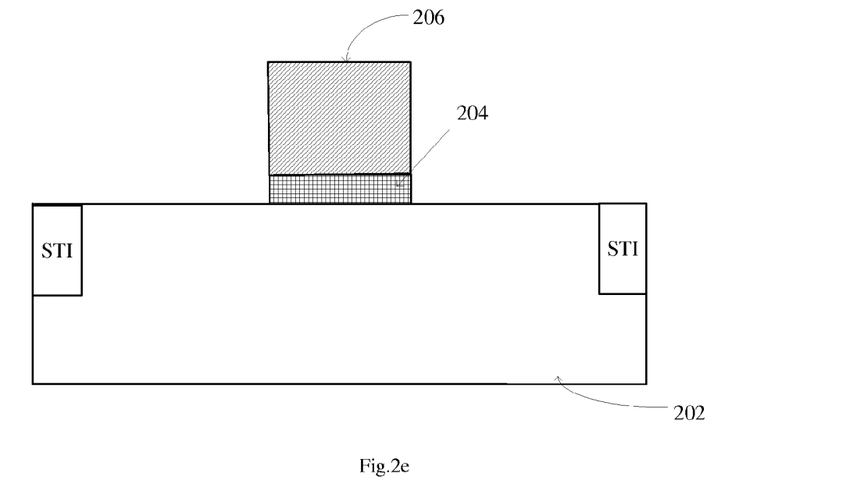

Elements that can introduce tensile strain to the channel, such as one of Ge, Sb, In, As, Ga and Sn or the combination thereof is doped or implanted into the polysilicon gate layer 206, as shown in FIG. 2d. The material composition ratio in the polysilicon thin film may be adjusted by one of the following means: selecting different doped or implanted elements or the combination thereof, controlling the dose of the doped or implanted elements, or controlling the distribution profile of the doped or implanted elements, thus the crystallization in the subsequent high temperature annealing process may be influenced and the size of the lattice in the grain may be changed, thereby the level and strength of the tensile strain that is introduced into the channel may be controlled. Thereafter, a part of the polysilicon gate layer and the gate dielectric layer is removed by, for example, the etching process, to thereby form the first gate structure, as shown in FIG. 2e.

Figure 2F:
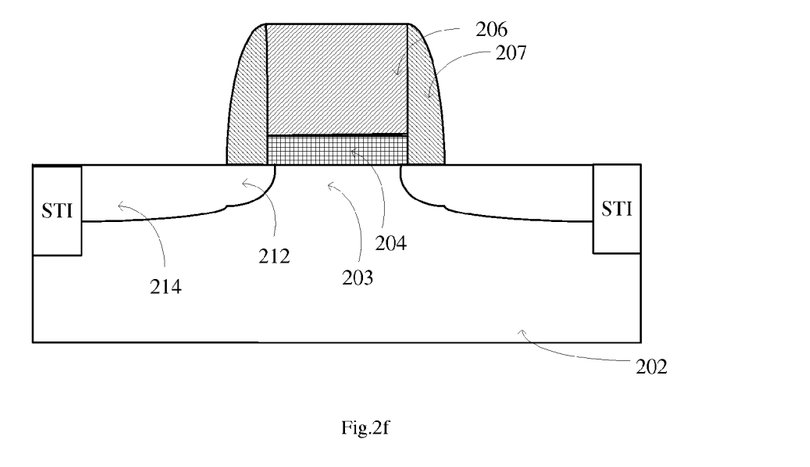

Then, a source/drain extension region 202 is formed by implantation in the source/drain region, and a source and drain 214 is formed by implantation after forming spacers 207 (as shown in FIG. 2f). Next, doping and annealing of the source/drain are performed, this process may be either one time annealing of the source/drain extension region and the contact region (i.e., the source/drain doped region outside the source/drain extension region) or the combination of one time annealing of the source/drain extension region and one time annealing of the contact region. The annealing techniques may be Furnace Annealing (FA), Rapid Thermal Annealing (RTA), Spike RTA, and Excimer Laser Annealing (ELA) etc. Taking RTA as an example, the temperature may be between 500~1100° C., and the time may be between 0.1~100 second.

Figure 2G:
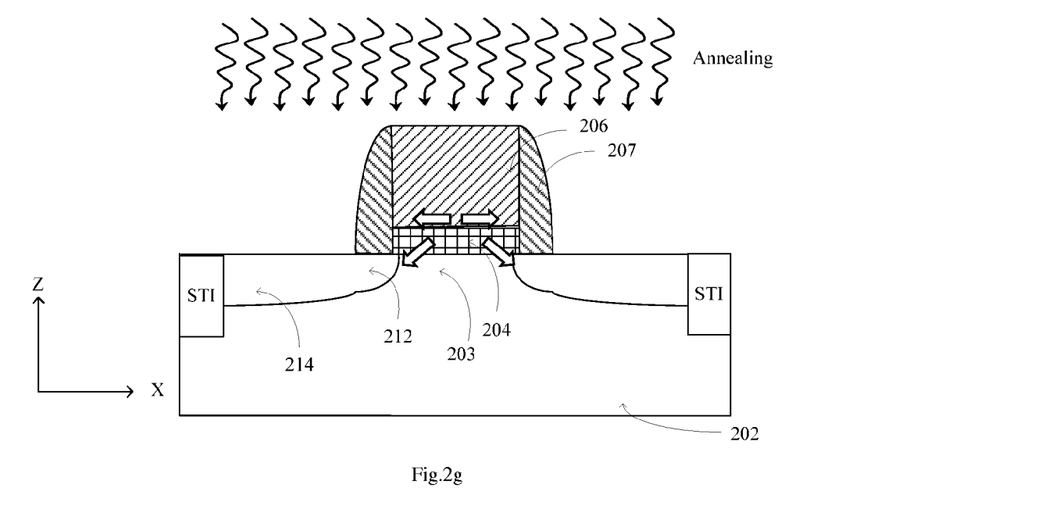

In the above annealing process, the doped/implanted gate structure can apply strain to the channel in directions as indicated by the hollow arrows in FIG. 2g, to thereby introduce tensile strain in a direction along the channel, i.e., direction X and introduce compressive strain in a direction perpendicular to the channel, i.e., direction Z, thus the mobility of electrons in the channel is enhanced. This is because lattice change occurs in the highly doped polysilicon thin film during the high temperature crystallization process, the lattice size is increased, thus tensile strain is produced in the thin film, meanwhile the tensile strain is passed through the ultrathin gate dielectric layer 204 and is conducted to the channel region 203 below during the annealing process, thus the size of the semiconductor lattice in the surface layer of the channel region is increased in a direction along the channel and is decreased in a direction perpendicular to the channel, thereby the strain produced in the gate electrode through the above steps can be maintained in the channel. Furthermore, the level of strain introduced into the channel may be controlled via the annealing conditions. Generally speaking, the higher of the temperature of RTA and the longer of the time of annealing, the more contributions it will make to the generation of strain lattice and the conduction of stress, but if the annealing condition is too strong, stress will be properly released and the distribution of source/drain doping will be destroyed.

The following steps are further needed when a MOS device is manufactured by using the gate-last process.

Figure 2H:
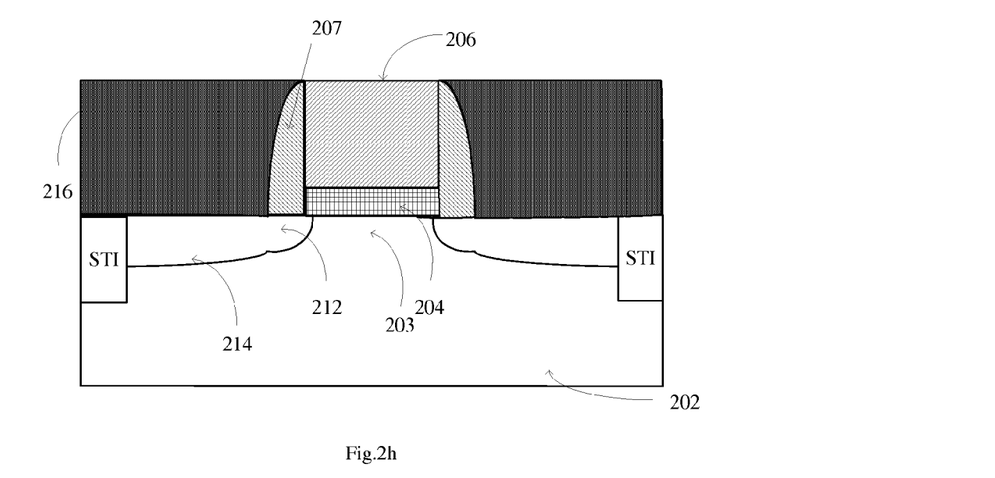

An Interlayer Dielectric Layer (ILD) is formed on the surface of a device and is planarized to the height of the gate structure, as shown in FIG. 2h.

Figure 2I:
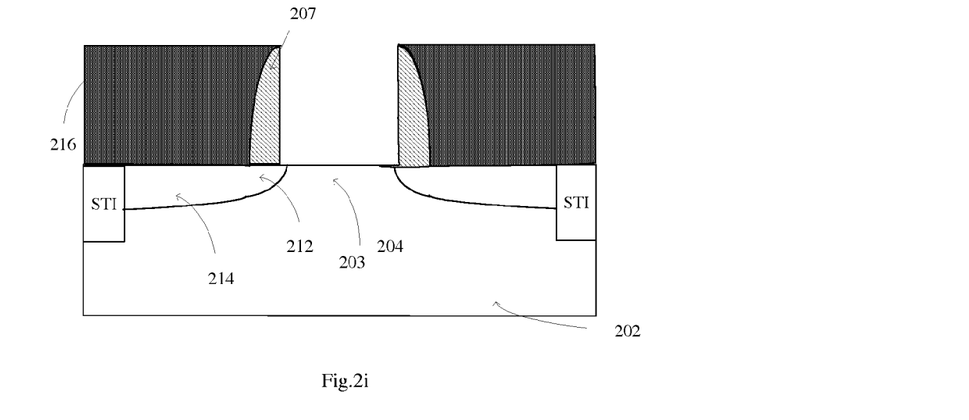
Figure 2J:
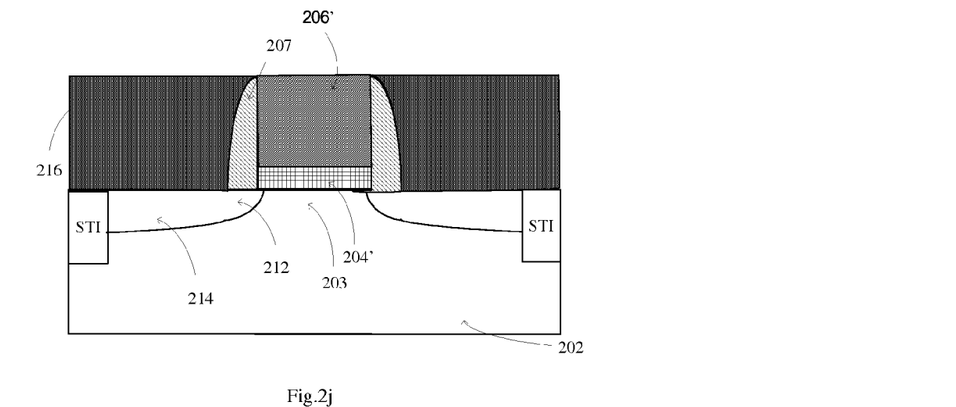

The polysilicon gate 206 and the gate dielectric layer 204 are removed by using, for example, a wet or dry etching process and are substituted by a metal gate conductor 206' and a new gate dielectric layer 204', respectively, as shown in FIGS. 2i-2j. As an alternative method, in this step it may only remove the polysilicon gate 206 while retain the gate dielectric layer 204, and then it only needs to deposit the metal gate conductor 206'. The materials of the NMOS metal gate are material with an appropriate work function and metal filling material (not shown in lamination in the Figure) sequentially formed by using Atomic Layer Deposition (ALD) or sputtering process, more preferably, the material with appropriate work function may be one of TiN, TaN, TiAlN and MoAlN, and the metal filling material may be one of TiAl, Al and W. The method for forming a new gate dielectric layer 204 is similar to the process for forming the gate dielectric layer 204, and the material thereof is high-K dielectric constant material, such as SiON, $ZrO_2$, $HfO_2$, $Al_2O_3$, HfSiO, HfAlO, HfSiON, HfAlSiO, HfTaSiO and/or combination thereof, and/or multi-layer structures thereof.

Figure 2K:
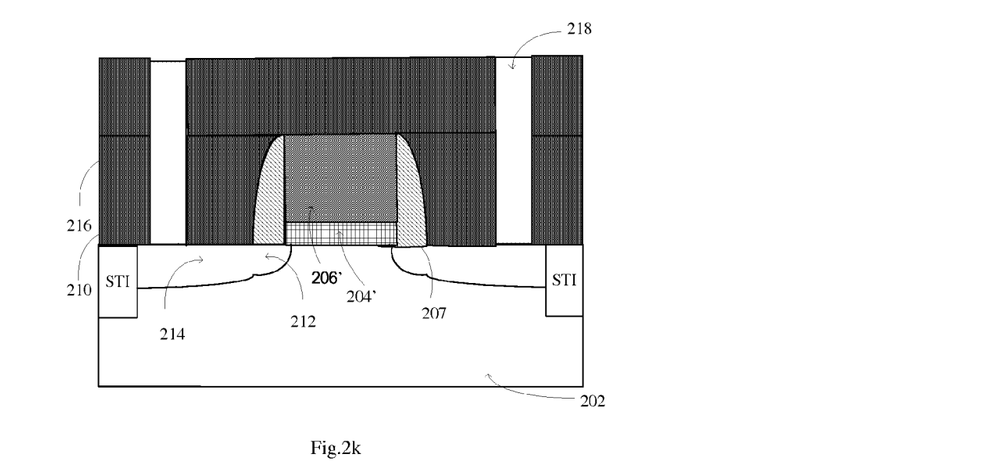

Another Interlayer Dielectric Layer (ILD) 216 is formed on the top surface of the source/drain and the gate for contacting, then source/drain metal contacts 218 are formed, thereby the device as shown in FIG. 2k is formed.

Other methods for introducing strain may be incorporated in the present invention. For example, alternatively, a stress source 208, including the embedded SiC or the stress source of any type formed by any future techniques, may be embedded into source and drain regions adjacent to the gate conductor, as shown in FIG. 2l.

Figure 2L:
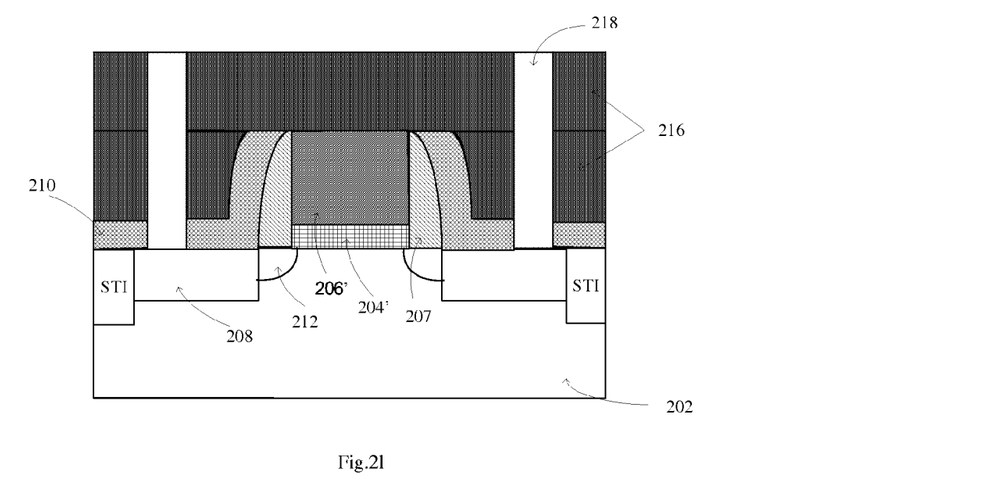

Alternatively, a stress liner 210 may be formed on the top of NMOS 200, as shown in FIG. 2l. The stress liner may apply a stress to the channel region under the gate conductor. Wherein the stress liner is formed on the top of the NMOS by deposition, for example, in a Plasma Enhanced Chemical Vapor Deposition (PECVD), but the stress liner may also be formed by other common methods except for PECVD. The stress liner may be nitride or oxide liner. However, it should be understood by those skilled in the art that the stress liner is not limited to nitride or oxide liner, other stress liner materials may also be used.

Tensile strain may be introduced into the channel by the above stress source and stress liner.

In brief, as compared with the method for generating channel strain adopted in the prior art, this method can introduce stronger strain into the channel and facilitate permanent memory of the strain by only adding the step of doping/implanting and using the annealing process in normal steps. Further, the level of tensile strain can be simply controlled by one of the following means: changing the doped or implanted elements or the combination thereof, controlling the dose of the doped or implanted elements, controlling the distribution profile of the doped or implanted elements, and controlling the annealing conditions. Indeed, if it is only for controlling the strain effect in the channel, materials that can introduce compressive strain into the channel, such as one of C, S, Al, B, P, N, O and H or the combination thereof may be doped or implanted into the polysilicon gate layer, which actually weakens the tensile strain in the NMOS channel. However, in some applications, if, for example, the tensile strain provided to the channel by other stress sources is too strong, the above doping/implanting that can weaken the tensile strain in the channel is desirable. To sum up the above descriptions, this method has greater process flexibility and simple process complexity with no additional process cost.

Second Embodiment

In this embodiment, the steps for manufacturing a PMOS device by using this method are provided. A semiconductor substrate 302 is provided, the semiconductor substrate may be of any type known in the field of electronics, such as bulk semiconductor, Semiconductor-On-Insulator (SOI), and the semiconductor substrate may be strained, non-strained, or may comprise therein a strain zone or a non-strain zone. When a semiconductor substrate is provided, isolation areas such as Shallow Trench Isolation (STI) area or Field Isolation area made of materials with or without stress are formed in the semiconductor substrate 302 by using the traditional technology commonly known in the art.

Figure 3A:
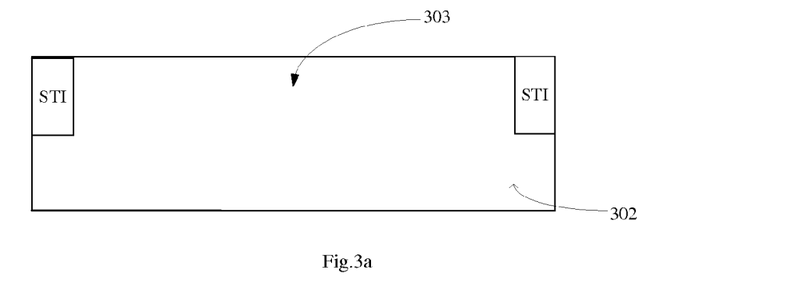

A channel 303 is formed on the semiconductor substrate in the active region between the isolation areas, as shown in FIG. 3a.

Figure 3B:
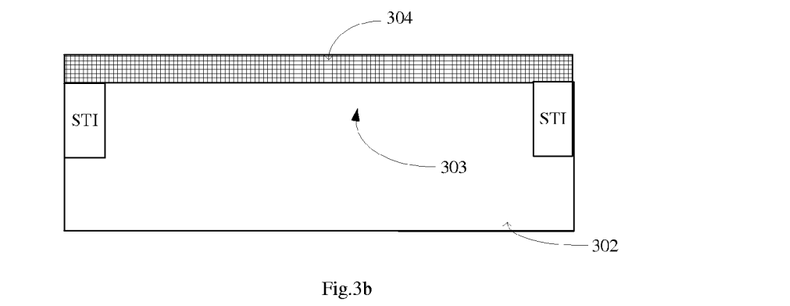

A gate dielectric layer 304 is formed on the channel, as shown in FIG. 3b, the materials of the gate dielectric layer 304 may include high-K dielectric constant material or low-K dielectric constant material, such as $SiO_2$, SiON, $ZrO_2$, $HfO_2$, $Al_2O_3$, HfSiO, HfAlO, HfSiON, HfAlSiO, HfTaSiO and/or combination thereof, and/or multi-layer structures thereof. The gate dielectric layer 304 may be formed by thermal growth processes such as oxidation, nitridation, or oxynitridation. As an alternative, the gate dielectric layer may be formed by deposition processes such as Chemical Vapor Deposition (CVD), plasma-assisted CVD, Atomic Layer Deposition (ALD), evaporation, reactive sputtering, chemical solution deposition or other similar deposition processes, and the gate dielectric layer 304 may also be formed by the combination of any of the above processes.

Figure 3C:
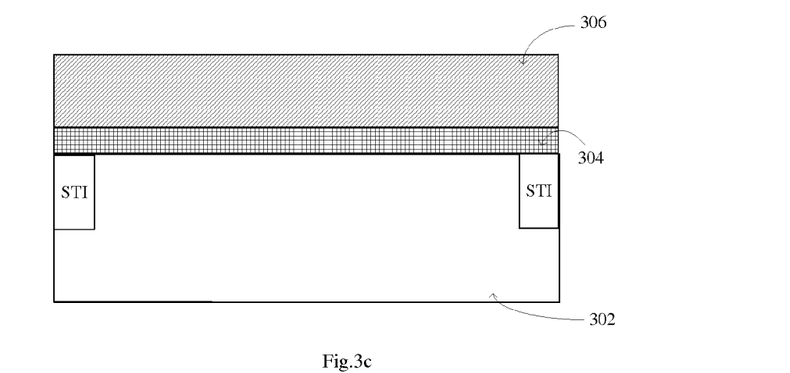

When the gate dielectric layer 304 is formed, a polysilicon gate layer 306 is formed on the gate dielectric layer 304, as shown in FIG. 3c.

Figure 3D:
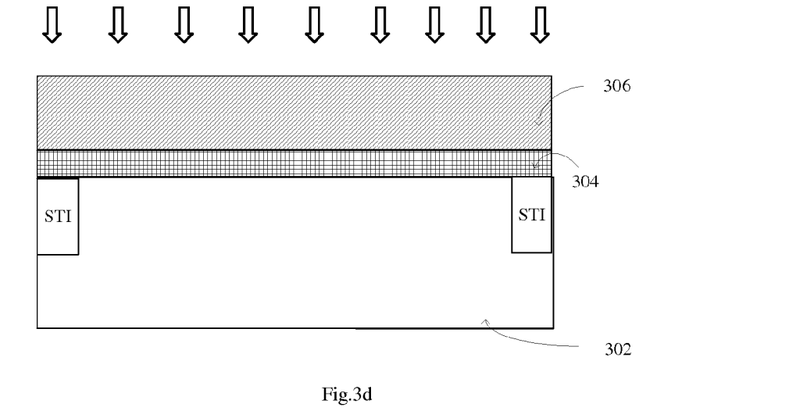
Figure 3E:
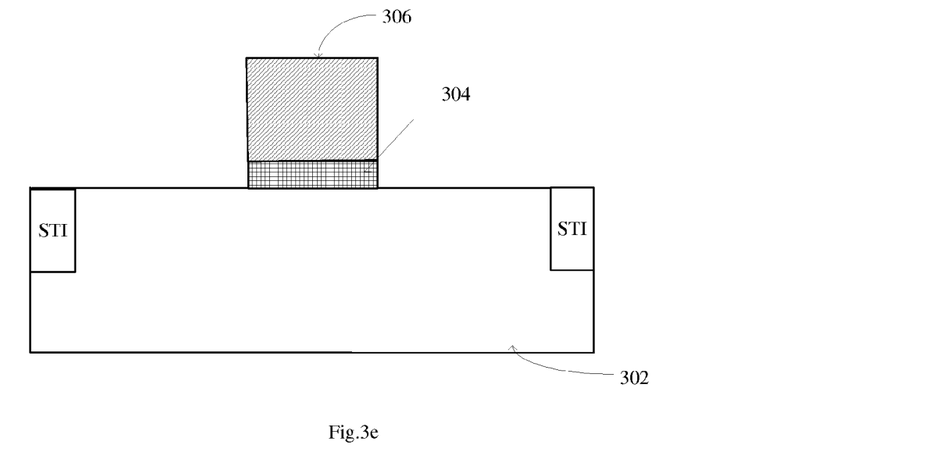

Elements that can introduce compressive strain to the channel, such as one of C, S, Al, B, P, N, O and H or the combination thereof is doped or implanted into the polysilicon gate layer 306, as shown in FIG. 3d. The material composition ratio in the polysilicon thin film may be adjusted by one of the following means: selecting different doped or implanted elements or the combination thereof, controlling the dose of the doped or implanted elements, or controlling the distribution profile of the doped or implanted elements, thus the crystallization in the subsequent high temperature annealing process may be influenced and the size of the lattice in the grain may be changed, thereby the level and strength of the compressive strain that is introduced into the channel may be controlled. Thereafter, a part of the polysilicon gate layer and the gate dielectric layer is removed by, for example, the etching process, to thereby form the first gate structure, as shown in FIG. 3e.

Figure 3F:
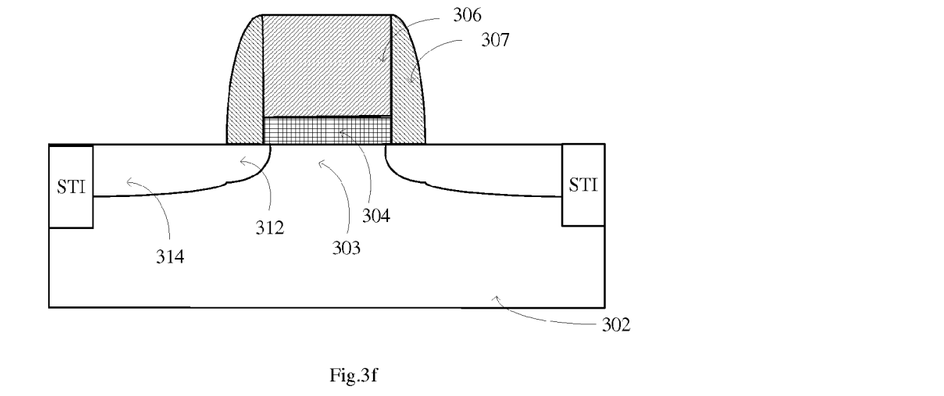

Then, a source/drain extension region 312 is formed by implantation in the source/drain region, and a source and drain 314 is formed by implantation after forming spacers 307 (as shown in FIG. 3f). Next, doping and annealing of the source/drain are performed, this process may be either one time annealing of the source/drain extension region and the contact region or the combination of one time annealing of the source/drain extension region and one time annealing of the contact region. The annealing techniques may be Furnace Annealing (FA), Rapid Thermal Annealing (RTA), Spike RTA, and Excimer Laser Annealing (ELA) etc.

Figure 3G:
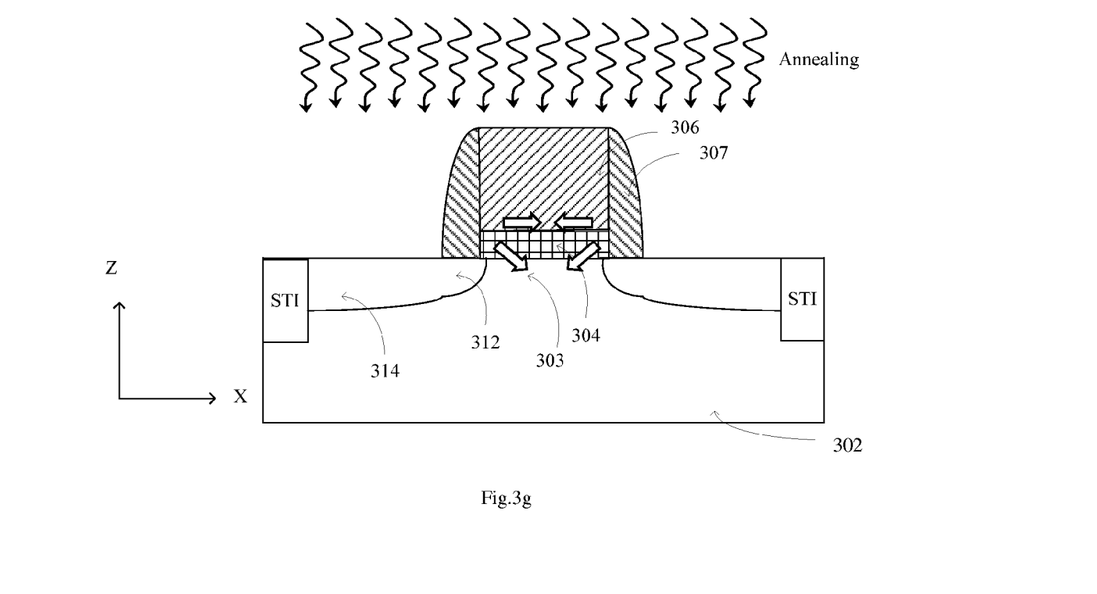

In the above annealing process, the doped/implanted gate structure can apply strain to the channel in directions as indicated by the hollow arrows in FIG. 3g, to thereby introduce compressive strain in a direction along the channel, i.e., direction X and introduce compressive strain in a direction perpendicular to the channel, i.e., direction Z, (note that although the compressive strain introduced in direction Z is not desirable, the compressive strain introduced in direction X is far greater than that in the direction Z), thus the mobility of holes in the channel is still generally enhanced. This is because lattice change occurs in the highly doped polysilicon thin film during the high temperature crystallization process, the lattice size is decreased, thus compressive strain is produced in the thin film, meanwhile the compressive strain is passed through the ultrathin gate dielectric layer 304 and is conducted to the channel region 303 below during the annealing process, thus the size of the semiconductor lattice in the surface layer of the channel region is decreased in a direction along the channel and is also decreased in a direction perpendicular to the channel, thereby the strain introduced into the gate electrode through the above steps can be memorized in the channel. Furthermore, the level of strain introduced into the channel may be controlled via the annealing conditions. Generally speaking, the higher of the temperature of RTA and the longer of the time of annealing, the more contributions it will make to the generation of strain lattice and the conduction of stress, but if the annealing condition is too strong, stress will be properly released and the distribution of source/drain doping will be destroyed.

The following steps are further needed when a MOS device is manufactured by using the gate-last process.

Figure 3H:
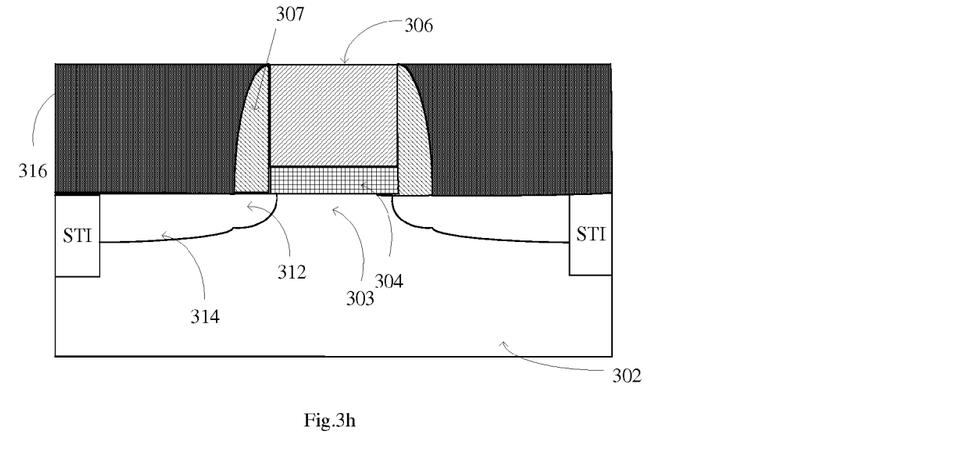

An Interlayer Dielectric Layer (ILD) is formed on the surface of a device and is planarized to the height of the gate structure, as shown in FIG. 3h.

Figure 3I:
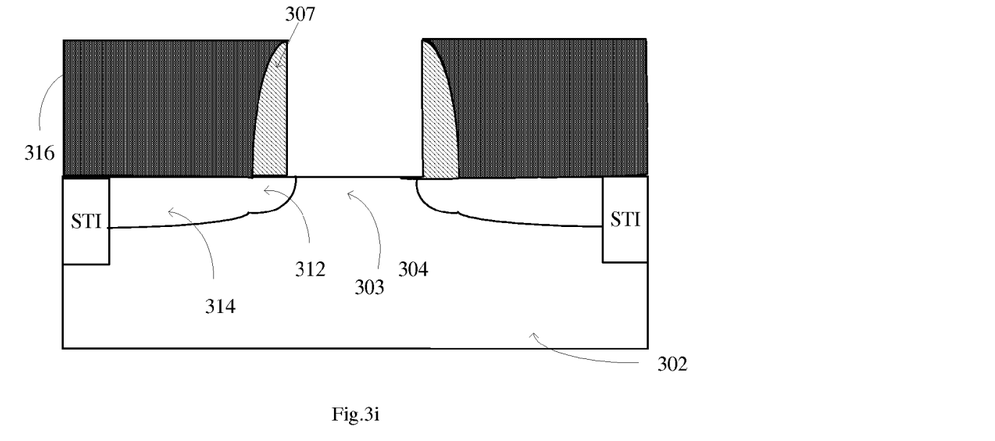
Figure 3J:
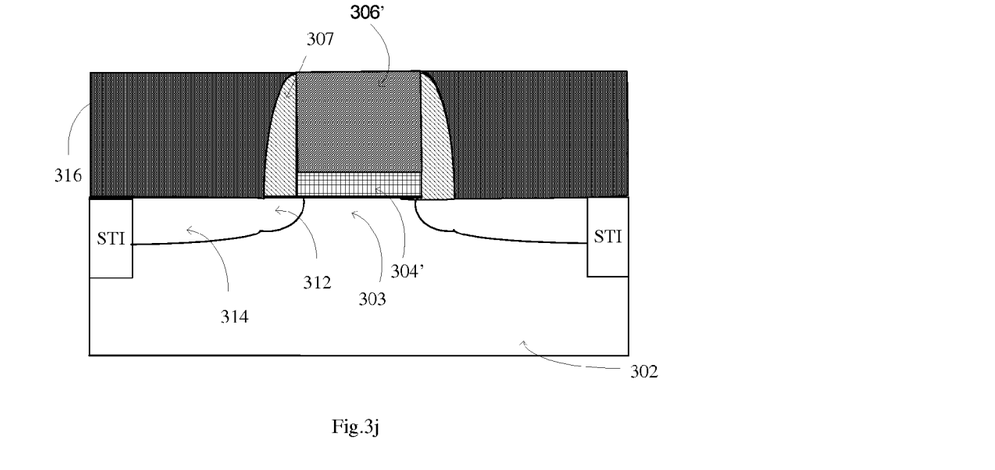

The polysilicon gate 306 and the gate dielectric layer 304 are removed by using, for example, a wet or dry etching process and are substituted by a metal gate conductor 306' and a new gate dielectric layer 304', respectively, as shown in FIGS. 3i-3j. As an alternative method, in this step it may only remove the polysilicon gate 306 while retain the gate dielectric layer 304, and then it only needs to deposit the metal gate conductor 306'. The materials of the PMOS metal gate are material with an appropriate work function and metal filling material (not shown in lamination in the Figure) sequentially formed by using Atomic Layer Deposition (ALD) or sputtering process, more preferably, the material with appropriate work function may be one of TiN, TaN, TiAlN or MoAlN, and the metal filling material may be one of TiAl, Al or W. The method for forming new gate dielectric layer 304' is similar to the process for forming the gate dielectric layer 304, and the material thereof is high-K dielectric constant material, such as SiON, $ZrO_2$, $HfO_2$, $Al_2O_3$, HfSiO, HfAlO, HfSiON, HfAlSiO, HfTaSiO and/or combination thereof, and/or multi-layer structures thereof.

Figure 3K:
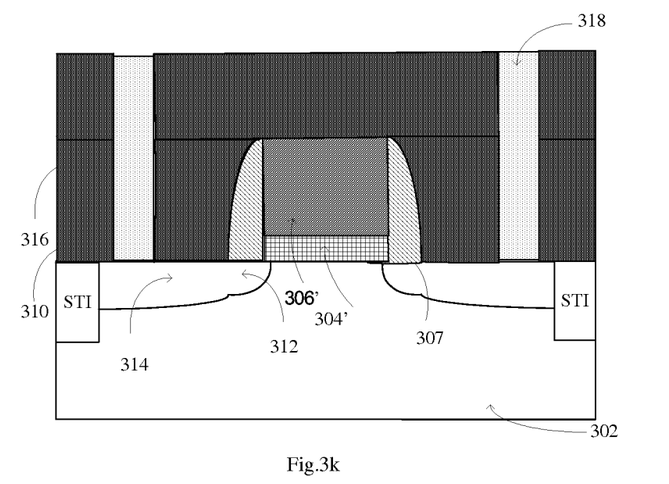

Another Interlayer Dielectric Layer (ILD) 316 is formed on the top surface of the source/drain and the gate for contacting, then source/drain metal contacts 318 are formed, thereby the device as shown in FIG. 3k is formed.

Other methods for introducing strain may be incorporated in the present invention. For example, alternatively, a stress source 308, including the embedded SiGe or the stress source of any type formed by any future techniques, may be embedded into source and drain regions adjacent to the gate conductor, as shown in FIG. 3l.

Figure 3L:
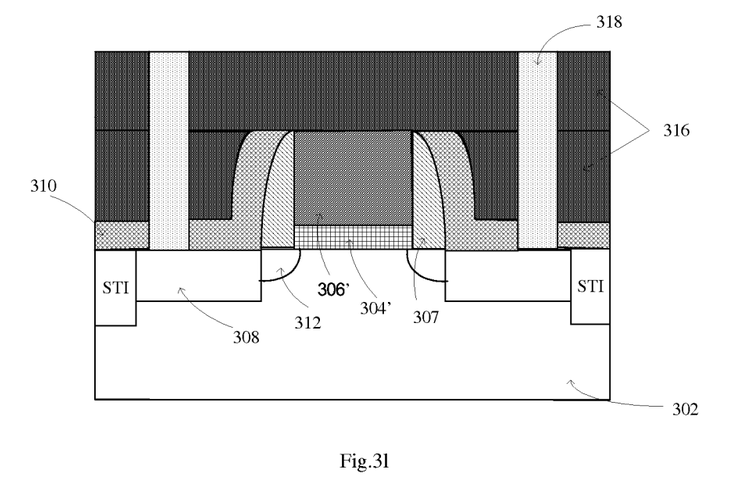

Alternatively, a stress liner 310 may be formed on the top of PMOS 300, as shown in FIG. 3l. The stress liner may apply a stress to the channel region under the gate conductor. Wherein the stress liner is formed on the top of the PMOS by deposition, for example, in a Plasma Enhanced Chemical Vapor Deposition (PECVD), but the stress liner may also be formed by other common methods except for PECVD. The stress liner may be nitride or oxide liner. However, it should be understood by those skilled in the art that the stress liner is not limited to nitride or oxide liner, other stress liner materials may also be used.

Compressive strain may be introduced into the channel by the above stress source and stress liner.

In brief, as compared with the method for enhancing channel strain adopted in the prior art, this method can introduce stronger strain into the channel and facilitate permanent memory of the strain by only adding the step of doping/implanting and using the annealing process in normal steps. Further, the level of tensile strain can be simply controlled by one of the following means: changing the doped or implanted elements or the combination thereof, controlling the dose of the doped or implanted elements, controlling the distribution profile of the doped or implanted elements, and controlling the annealing conditions. Indeed, if it is only for controlling the strain effect in the channel, materials that can introduce compressive strain into the channel, such as one of Ge, Sb, In, As, Ga and Sn or the combination thereof may be doped or implanted into the polysilicon gate layer, which actually weakens the compressive strain in the PMOS channel. However, in some applications, if, for example, the compressive strain provided to the channel by other stress sources is too strong, the above doping/implanting that can weaken the compressive strain in the channel is desirable. To sum up the above descriptions, this method has greater process flexibility and simple process complexity with no additional process cost.

What is claimed is:

1. A method of introducing strain into the channel of a MOS device, comprising:
   providing a semiconductor substrate;
   forming a channel in the semiconductor substrate;
   forming a first gate dielectric layer on the channel;
   forming a polysilicon gate layer on the first gate dielectric layer;
   doping or implanting a first element into the polysilicon gate layer;
   removing a part of the first gate dielectric layer and polysilicon gate layer to thereby form a first gate structure;
   forming a source/drain extension region in the channel;
   forming spacers on both sides of the first gate structure;
   forming a source/drain in the channel;
   performing annealing such that lattice change occurs in the polysilicon that is doped or implanted with the first element in the high-temperature crystallization process, thereby producing the strain including a horizontal strain component in a direction along the channel and a vertical strain component in a direction perpendicular to the channel in the polysilicon gate layer, and introducing the strain to the channel through the gate dielectric layer to cause a change in the size of the semiconductor lattice in the surface layer of the channel region such that the strain is maintained in the channel;
   removing the polysilicon gate layer to form an opening by using a wet or dry etching process; and
   filling the opening with a metal gate layer, thereby forming the MOS device by a gate-last process.

2. The method of introducing strain into the channel of a MOS device according to claim 1, wherein the first element is one of Ge, Sb, In, As, Ga and Sn or the combination thereof, thus the strain in a direction along the channel is tensile strain and the strain in a direction perpendicular to the channel is compressive strain.

3. The method of introducing strain into the channel of a MOS device according to claim 1, wherein the first element is one of C, S, Al, B, P, N, O and H or the combination thereof, thus the strain in a direction along the channel is compressive strain and the strain in a direction perpendicular to the channel is compressive strain.

4. The method of introducing strain into the channel of a MOS device according to claim 2, wherein further comprising the step of adjusting the material composition ratio in the polysilicon by changing the dose of the doped or implanted elements, or changing the distribution profile of the doped or implanted elements, thus the size of the lattice can be changed, and thereby the level of the strain that is introduced into the channel can be controlled.

5. The method of introducing strain into the channel of a MOS device according to claim 1, wherein annealing is Furnace Annealing (FA), Rapid Thermal Annealing (RTA), Spike RTA, or Excimer Laser Annealing (ELA).

6. The method of introducing strain into the channel of a MOS device according to claim 5, wherein further comprising the steps of changing the annealing temperature or time to control the level of the strain that is introduced into the channel.

7. The method of introducing strain into the channel of a MOS device according to claim 6, the temperature of RTA is between 500-1100° C., and the time is between 0.1~100 second.

8. The method of introducing strain into the channel of a MOS device according to claim 1, wherein the first gate dielectric layer is made of one of $SiO_2$, SiON, $ZrO_2$, $HfO_2$, $Al_2O_3$, HfSiO, HfAlO, HfSiON, HfAlSiO, HfTaSiO and/or combination thereof, and/or multi-layer structures thereof.

9. The method of introducing strain into the channel of a MOS device according to claim 1, further comprising at least one of the following steps: embedding a stress source into source and drain regions; forming a stress liner on the MOS device, to thereby introduce a second stress into the channel.

10. A MOS device, comprising:
a semiconductor substrate;
a channel formed in the semiconductor substrate;
a second gate structure formed above the channel, comprising a second gate dielectric layer and a metal gate layer over the second gate dielectric layer;
a source/drain extension region formed in the channel;
spacers formed on both sides of the second gate structure;
a source/drain formed in the channel;
an interlayer dielectric layer formed on the source/drain and the second gate structure;
a source/drain metal contact through the interlayer dielectric layer; and
a stress source, embedded into source/drain;
wherein the second gate dielectric layer and the metal gate layer are obtained by replacing the first gate dielectric layer and the polysilicon gate layer obtained via the steps as stated in claim 1, wherein a change occurs in the size of the semiconductor lattice in the surface layer of the channel region such that the strain is maintained in the channel.

11. The MOS device according to claim 10, further comprising a stress liner formed on the MOS device.

12. The MOS device according to claim 11, wherein the MOS device is an NMOS device, and the stress source and the stress liner both have tensile stress.

13. The MOS device according to claim 11, wherein the MOS device is a PMOS device, and the stress source and the stress liner both have compressive stress.

14. The MOS device according to claim 11, wherein the second gate dielectric layer is made of one of SiON, $ZrO_2$, $HfO_2$, $Al_2O_3$, HfSiO, HfAlO, HfSiON, HfAlSiO, HfTaSiO and/or combination thereof, and/or multi-layer structures thereof.

15. The MOS device according to claim 11, wherein the metal gate layer comprising two layers, wherein one layer is made of TiN, TaN, TiAlN or MoAlN with appropriate work function for the MOS device, and the other layer thereon is made of TiAl, Al or W.

16. The method of introducing strain into the channel of a MOS device according to claim 3, wherein further comprising the step of adjusting the material composition ratio in the polysilicon by changing the dose of the doped or implanted elements, or changing the distribution profile of the doped or implanted elements, thus the size of the lattice can be changed, and thereby the level of the strain that is introduced into the channel can be controlled.

* * * * *